United States Patent
Hung et al.

[11] Patent Number: 6,069,442
[45] Date of Patent: May 30, 2000

[54] ORGANIC ELECTROLUMINESCENT DEVICE WITH INORGANIC ELECTRON TRANSPORTING LAYER

[75] Inventors: Liang-Sun Hung, Webster; Joseph K. Madathil, Rochester, both of N.Y.

[73] Assignee: Eastman Kodak Company, Rochester, N.Y.

[21] Appl. No.: 08/937,217

[22] Filed: Sep. 18, 1997

[51] Int. Cl.[7] .............................. H01J 1/62; H01J 63/04
[52] U.S. Cl. ...................... 313/504; 313/506; 313/507; 313/509
[58] Field of Search ................... 313/502–507, 313/509

[56] References Cited

U.S. PATENT DOCUMENTS

| | | | |
|---|---|---|---|
| 5,767,622 | 6/1998 | Hueppauff et al. | 313/506 X |
| 5,776,622 | 7/1998 | Hung et al. | 313/506 X |
| 5,783,292 | 7/1998 | Tokito et al. | 313/506 X |

*Primary Examiner*—Nimeshkumar D. Patel
*Assistant Examiner*—Mack Haynes
*Attorney, Agent, or Firm*—Raymond L. Owens

[57] ABSTRACT

An organic EL device, includes an anode, an anode, an organic hole transporting layer over the anode, an organic luminescent layer on the organic hole transporting layer, an inorganic electron transporting layer over the organic luminescent layer, and a cathode on the electron transporting layer.

21 Claims, 3 Drawing Sheets

ORGANIC ELECTROLUMINESCENT DEVICE WITH INORGANIC ELECTRON TRANSPORTING LAYER

FIELD OF THE INVENTION

This invention relates to organic electroluminescent (EL) devices. More specifically, this invention relates to electroluminescent devices with efficient electron transport.

BACKGROUND OF THE INVENTION

Organic EL devices are known to be highly efficient and are capable of producing a wide range of colors. Useful applications such as flat-panel displays have been contemplated. Representative of earlier organic EL devices are Gurnee et al U.S. Pat. No. 3,172,862, issued Mar. 9, 1965; Gurnee U.S. Pat. No. 3,173,050, issued Mar. 9, 1965; Dresner, "Double Injection Electroluminescence in Anthracene," RCA Review, Vol. 30, pp. 322–334, 1969; and Dresner U.S. Pat. No. 3,710,167, issued Jan. 9, 1973. Typical organic emitting materials were formed of a conjugated organic host material and a conjugated organic activating agent having condensed benzene rings. The organic emitting material was present as a single layer medium having a thickness much above 1 micrometer. Thus, this organic EL medium was highly resistive and the EL device required an extremely high voltage (>100 volts) to operate.

The most recent discoveries in the art of organic EL device construction have resulted in devices having the organic EL medium consisting of extremely thin layers (<1.0 micrometer in combined thickness) separating the anode and cathode. The thin organic EL medium offers reduced resistance, permitting higher current densities for a given level of electrical bias voltage. In a basic two-layer EL device structure, one organic layer is specifically chosen to inject and transport holes and the other organic layer is specifically chosen to inject and transport electrons. The interface between the two layers provides an efficient site for the recombination of the injected hole-electron pair and resultant electroluminescence. Examples are provided by U.S. Pat. Nos. 4,356,429; 4,539,507; 4,720,432; 4,885,211; 4,950,950; 5,047,687; 5,059,861; 5,061,569; 5,073,446; 5,141,671; 5,150,006 and 5,151,629.

The simple structure can be modified to a three-layer structure, in which an additional luminescent layer is introduced between the hole and electron transporting layers to function primarily as the site for hole-electron recombination and thus electroluminescence. In this respect, the functions of the individual organic layers are distinct and can therefore be optimized independently. Thus, the luminescent or recombination layer can be chosen to have a desirable EL color as well as a high luminance efficiency. Likewise, the electron and hole transport layers can be optimized primarily for the carrier transport property.

One inherent drawback of the organic EL devices is that the mobility of electrons in organic materials is extremely low, so that a high voltage is required to produce a strong electric field. For instance, the mobility of electrons in Alq is in the range of $10^{-6}$–$10^{-7}$ cm$^2$/V·S, and thus a field of $1 \times 10^6$ V/cm is necessary for efficient electron transport. The thickness of the organic medium can be reduced to lower the voltage level required for device operation, however, the reduction results in low quantum efficiency due to the effect of radiative quenching by a conducting surface, high leakage current, or device shorting.

SUMMARY OF THE INVENTION

It is an object of the present invention to provide an organic EL device with efficient electron transport.

The above object is achieved in an organic EL device, comprising an anode, an organic hole transporting layer over the anode, an organic luminescent layer on the organic hole transporting layer, an inorganic electron transporting layer over the organic luminescent layer, and a cathode on the electron transporting layer.

The new device exhibits superior current-voltage and luminescence-voltage characteristics over a conventional EL device with an organic electron transporting layer.

BRIEF DESCRIPTION OF THE DRAWINGS

These and other advantages of this invention can be better appreciated by reference to the following detailed description considered in conjunction with the drawings in which.

DETAILED DESCRIPTION OF THE PREFERRED EMBODIMENTS

Figure 1:
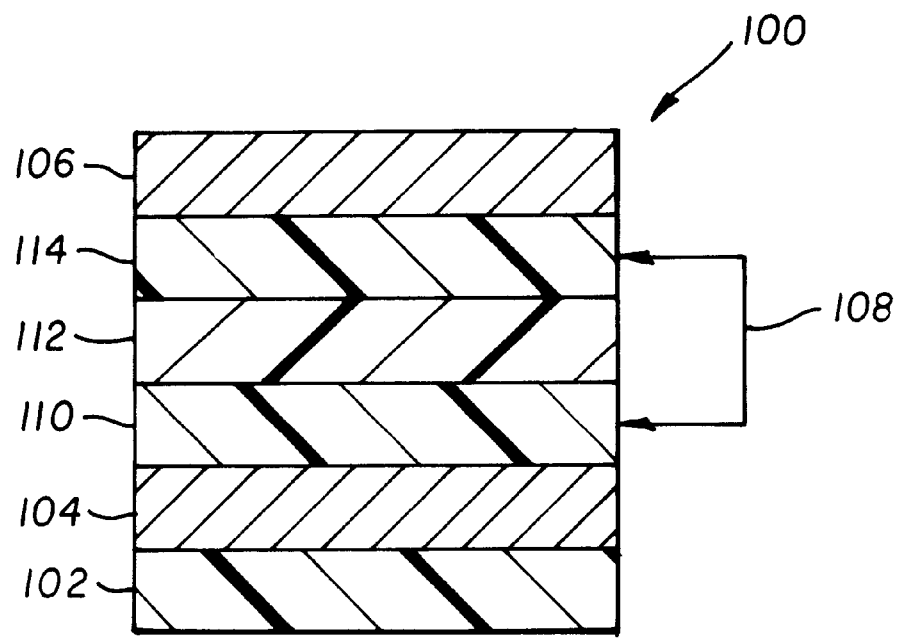
FIG. 1 is a schematic diagram of an embodiment of the multi-layer structures of EL devices in accordance with the present invention.
Figure 2:
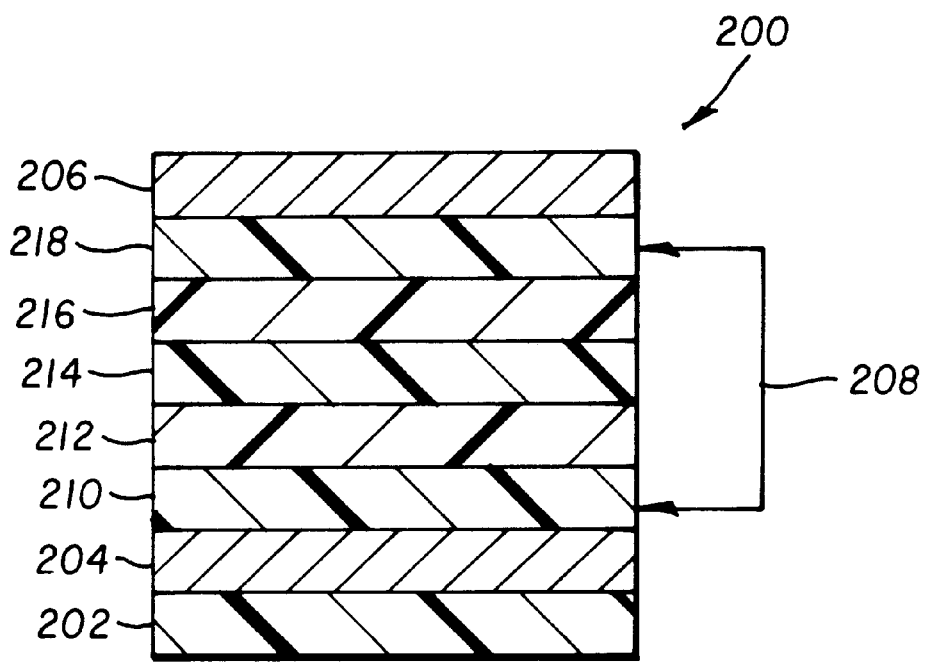
FIG. 2 is a schematic diagram of an another embodiment of the multi-layer structures of EL devices in accordance with the present invention.

An EL device 100 according to the invention is schematically illustrated in FIG. 1. The support layer 102 is an electrically insulating and an optically transparent material such as glass or plastic. Anode 104 is separated from cathode 106 by an EL medium 108, which, as shown, includes three superimposed layers. Layer 110 adjacent to anode 104 is the hole transporting layer. Layer 114 adjacent to cathode 106 is the electron transporting layer. Layer 112 which is in between the hole transporting layer 110 and the electron transporting layer 114 is the luminescent layer. This luminescent layer 112 also serves as the recombination layer where the hole and electron recombines. In the present invention both hole transporting layer 110 and luminescent layer 112 are formed of organic materials, while electron transporting layer 114 is formed of inorganic materials. The electron transporting layer 114 can be formed on the luminescent layer 112 as shown in FIG. 1 or over the luminescent layer 112 as will be discussed in FIG. 2. The anode and the cathode are connected to an external AC or DC power source (not shown). The power source can be pulsed, periodic, or continuous.

In operation, the EL device 100 can be viewed as a diode which is forward biased when the anode is at a higher potential than the cathode. Under these conditions, holes (positive charge carriers) are injected from the anode into the hole transporting layer 110, and electrons are injected into the electron transporting layer 114. The injected holes and electrons each migrate toward the oppositely charged electrode. This results in hole-electron recombination and a release of energy in part as light, thus producing electroluminescence.

Organic device 200 is illustrative of yet another preferred embodiment of the present invention. The insulating and transparent support is layer 202. The anode 204 is separated from the cathode 206 by an EL medium 208, which, as shown, includes five superimposed layers. Located on top of the anode layer 204 are, in sequence, the organic hole injecting layer 210, the organic hole transporting layer 212, the organic luminescent layer 214, the fluoride layer 216, and the inorganic electron transporting layer 218. The structure of device 200 is similar to device 100, except that a thin fluoride layer 216 is added to improve the efficiency of electron transport from the electron transporting layer 218 into the luminescent layer 214.

A substrate 102 and 202 for the EL devices 100 and 200, respectively, is electrically insulating and light transparent. The light transparent property is desirable for viewing the EL emission through the substrate. For applications where the EL emission is viewed through the top electrode, the transmissive characteristic of the support is immaterial, and therefore any appropriate substrate such as opaque semiconductor and ceramic wafers can be used. Of course, it is necessary to provide in these device configurations a light transparent top electrode.

The composition of the EL medium is described as follows, with particular reference to device structure 200.

A layer containing a porphyrinic compound forms the hole injecting layer of the organic EL device. A porphyrinic compound is any compound, natural or synthetic, which is derived from or includes a porphyrin structure, including porphine itself. Any of the prophyrinic compounds disclosed by Adler, U.S. Pat. No. 3,935,031 or Tang U.S. Pat. No. 4,356,429, the disclosures of which are here incorporated by reference, can be employed.

The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinyl radicals and/or containing at least one active hydrogen containing group are disclosed by Brantley et al U.S. Pat. Nos. 3,567,450 and 3,658,520.

The luminescent layer of the organic EL device comprises of a luminescent or fluorescent material where electroluminescence is produced as a result of electron-hole pair recombination in this region. In the simplest construction, the luminescent layer comprises of a single component, that is a pure material with a high fluorescent efficiency. A well known material is tris (8-quinolinato) Aluminum, (Alq), which produces excellent green electroluminescence. A preferred embodiment of the luminescent layer comprises a multi-component material consisting of a host material doped with one or more components of fluorescent dyes. Using this method, highly efficient EL devices can be constructed. Simultaneously, the color of the EL devices can be tuned by using fluorescent dyes of different emission wavelengths in a common host material. This dopant scheme has been described in considerable details for EL devices using Alq as the host material by Tang et al [J. Applied Physics, Vol. 65, Pages 3610–3616, 1989; U.S. Pat. No 4,769,292].

The inorganic electron transporting layer is an essential part in this invention. Preferred materials for use in forming the electron transporting layer are inorganic n-type semiconducting materials. The materials should have a resistivity in the range of $1-10^5$ ohm-cm, be transmissive or semi-transitive to visible light, and be inert with respect to the organic luminescent layer.

An important relationship for choosing an inorganic semiconducting material to form the electron transporting layer on an organic luminescent layer is the comparison of the electron affinity of the inorganic material and the energy level of the lowest unoccupied molecular orbital ($E_{LUMO}$) of the organic material. The electron affinity should not be greater than the $E_{LUMO}$ by 1.5 eV in order to achieve efficient electron transport.

The inorganic semiconducting materials can be a metal oxide, metal nitride, zinc sulfide, zinc selenide, or zinc telluride. For those materials, the electron mobility is several orders of magnitude greater than that in organic materials, and the resistivity can be readily adjusted by impurity doping or controlling ambient. Examples described in this invention indicate that zinc oxide and indium oxide are suitable materials. Other materials can be titanium oxide, strontium titanium oxide, barium titanium oxide, gallium nitride, or indium gallium nitride.

The thickness of the inorganic layer is so selected that it would provide a sufficient space separation between the luminescent layer and the top cathode. A useful range of the thickness is from 20 to 2,000 nm, preferably 50–500 nm. This inorganic layer can be deposited by many conventional means, such as evaporation, sputtering, laser ablation, and chemical vapor deposition.

The fluoride layer has an important contribution to this invention. The presence of a fluoride on the luminescent layer results in band bending, thus substantially lowering the barrier height for electron transport at the interface between the electron transporting layer and the luminescent layer. The fluoride layer used for band bending can be selected from an alkali fluoride or an alkaline earth fluoride, which include lithium fluoride, sodium fluoride, potassium fluoride, rubidium fluoride, cesium fluoride, magnesium fluoride, calcium fluoride, strontium fluoride, or barium fluoride.

The anode and cathode of the organic EL device can each take any convenient conventional form. Where it is intended to transmit light from the organic EL device through the anode, this can be conveniently achieved by coating a thin conductive layer onto a light transparent substrate—e.g., a transparent or substantially transparent glass plate or plastic film. In one form the organic EL devices of this invention can follow the conventional practice of including a light transparent anode formed of tin oxide or indium tin oxide coated on a glass plate, as disclosed by Gurnee et al U.S. Pat. No. 3,172,862, Gurnee U.S. Pat. No. 3,173,050, Dresner "Double Injection Electroluminescence in Anthracene", RCA Review, Volume 30, pages 322–334, 1969; and Dresner U.S. Pat. No. 3,710,167 cited above.

The organic EL devices of this invention can employ a cathode constructed of any metal, including any high or low work function metal, heretofore taught to be useful for this purpose. Unexpected fabrication, performance, and stability advantages have been realized by forming the cathode of a combination of a low work function metal and at least one other metal. For further disclosure, see U.S. Pat. No. 4,885,211 by Tang and Van Slyke, the disclosure of which is incorporated by reference herein. A bilayer structure of LiF/Al has been used to enhance electron injection, as disclosed in U.S. Pat. No. 5,624,604 by Hung et al.

EXAMPLES

The invention and its advantages are further illustrated by the specific examples as follows:

Example 1

An EL device satisfying the requirements of the invention was constructed in the following manner. The EL medium has four organic layers, namely, a hole injecting layer, a hole transporting layer, a luminescent layer, and an electron transporting layer a) An indium-tin-oxide (ITO) coated glass substrate was sequentially ultrasonicated in a commercial detergent, rinsed in deionized water, degreased in toluene vapor and exposed to oxygen plasma for a few minutes.

b) A hole injecting layer of copper phthalocyanine (150 Angstroms) was then deposited on top of the ITO coated substrate by evaporation from a tantalum boat.

c) Onto the copper phthalocyanine layer was deposited a hole transporting layer of N,N'-bis-(1-naphthyl)-N,N'-diphenylbenzidine (600 Angstroms), also by evaporation from a tantalum boat.

d) A luminescent layer of Alq doped with 1% coumarin 6 (300 Angstroms) was then deposited onto the hole transporting layer by evaporation from a tantalum boat.

e) An electron transporting layer of Alq (450 Angstroms) was then deposited onto the luminescent layer by evaporation from a tantalum boat.

f) On top of the Alq layer was deposited by evaporation a cathode layer (2000 Angstroms) formed of a 10:1 atomic ratio of Mg and Ag.

The above sequence completed the deposition of the EL device. The device was then hermetically packaged in a dry glove box for protection against ambient environment.

The drive voltage was 12.3 V at a current density of 100 mA/cm$^2$. The luminescence output from this EL device was 0.52 mW/cm$^2$ when it was operated at 9 V.

Example 2

An EL device satisfying the requirements of the invention was constructed in the following manner. The EL medium has three organic layers, namely, a hole injecting layer, a hole transporting layer, and a luminescent layer.

a) An indium-tin-oxide (ITO) coated glass substrate was sequentially ultrasonicated in a commercial detergent, rinsed in deionized water, degreased in toluene vapor and exposed to oxygen plasma for a few minutes.

b) A hole injecting layer of copper phthalocyanine (150 Angstroms) was then deposited on top of the ITO coated substrate by evaporation from a tantalum boat.

c) Onto the copper phthalocyanine layer was deposited a hole transporting layer of N,N'-bis-(1-naphthyl)-N,N'-diphenylbenzidine (600 Angstroms), also by evaporation from a tantalum boat.

d) A luminescent layer of Alq doped with 1% coumarin 6 (300 Angstroms) was then deposited onto the hole transporting layer by evaporation from a tantalum boat.

e) On top of the luminescent layer was deposited by evaporation a cathode layer (2000 Angstroms) formed of a 10:1 atomic ratio of Mg and Ag.

The above sequence completed the deposition of the EL device. The device was then hermetically packaged in a dry glove box for protection against ambient environment.

The drive voltage was 9.0 V at a current density of 100 mA/cm$^2$. The luminescence output from this EL device was 1.65 mW/cm$^2$ when it was operated at 9 V. The EL devices exhibited a high leakage current, and electrical shorting was commonly observed.

Example 3

An EL device satisfying the requirements of the invention was constructed in the following manner. The EL medium has three organic layers, namely, a hole injecting layer, a hole transporting layer, and a luminescent layer, and one inorganic layer, namely an electron transporting layer.

a) An indium-tin-oxide (ITO) coated glass substrate was sequentially ultrasonicated in a commercial detergent, rinsed in deionized water, degreased in toluene vapor and exposed to oxygen plasma for a few minutes.

b) A hole injecting layer of copper phthalocyanine (150 Angstroms) was then deposited on top of the ITO coated substrate by evaporation from a tantalum boat.

c) Onto the copper phthalocyanine layer was deposited a hole transporting layer of N,N'-bis-(1-naphthyl)-N,N'-diphenylbenzidine (600 Angstroms), also by evaporation from a tantalum boat.

d) A luminescent layer of Alq doped with 1% coumarin 6 (300 Angstroms) was then deposited onto the hole-transport layer by evaporation from a tantalum boat.

e) An electron transporting layer of zinc oxide (350 Angstroms) was then deposited onto the luminescent layer by evaporation from a graphite boat.

f) On top of the electron transporting layer was deposited by evaporation a cathode layer (2000 Angstroms) formed of a 10:1 atomic ratio of Mg and Ag.

The above sequence completed the deposition of the EL device. The device was then hermetically packaged in a dry glove box for protection against ambient environment.

The drive voltage was 10.2 V at a current density of 100 mA/cm$^2$. The luminescence output from this EL device was 1.90 mW/cm$^2$ when it was operated at 9 V.

Example 4

An EL device satisfying the requirements of the invention was constructed in the following manner. The medium has three organic layers, namely, a hole injecting layer, a hole transporting layer, and a luminescent layer, and two inorganic layers, namely a fluoride layer and an electron transporting layer.

a) An indium-tin-oxide (ITO) coated glass substrate was sequentially ultrasonicated in a commercial detergent, rinsed in deionized water, degreased in toluene vapor and exposed to oxygen plasma for a few minutes.

b) A hole injecting layer of copper phthalocyanine (150 Angstroms) was then deposited on top of the ITO coated substrate by evaporation from a tantalum boat.

c) Onto the copper phthalocyanine layer was deposited a hole transporting layer of N,N'-bis-(I-naphthyl)-N,N'-diphenylbenzidine (600 Angstroms), also by evaporation from a tantalum boat.

d) A luminescent layer of Alq doped with 1% coumarin 6 (300 Angstroms) was then deposited onto the hole transporting layer by evaporation from a tantalum boat.

e) A thin layer of LiF (10 Angstroms) was then deposited onto the luminescent layer by evaporation from a tantalum boat.

f) An electron transporting layer of zinc oxide (350 Angstroms) was then deposited onto the fluoride layer by evaporation from a graphite boat.

g) On top of the electron transporting layer was deposited by evaporation a cathode layer (2000 Angstroms) formed of a 10:1 atomic ratio of Mg and Ag.

The above sequence completed the deposition of the EL device. The device was then hermetically packaged in a dry glove box for protection against ambient environment.

The drive voltage was 9.1 V at a current density of 100 mA/cm$^2$. The luminescence output from this EL device was 3.35 mW/cm$^2$ when it was operated at 9 V.

Figure 3:
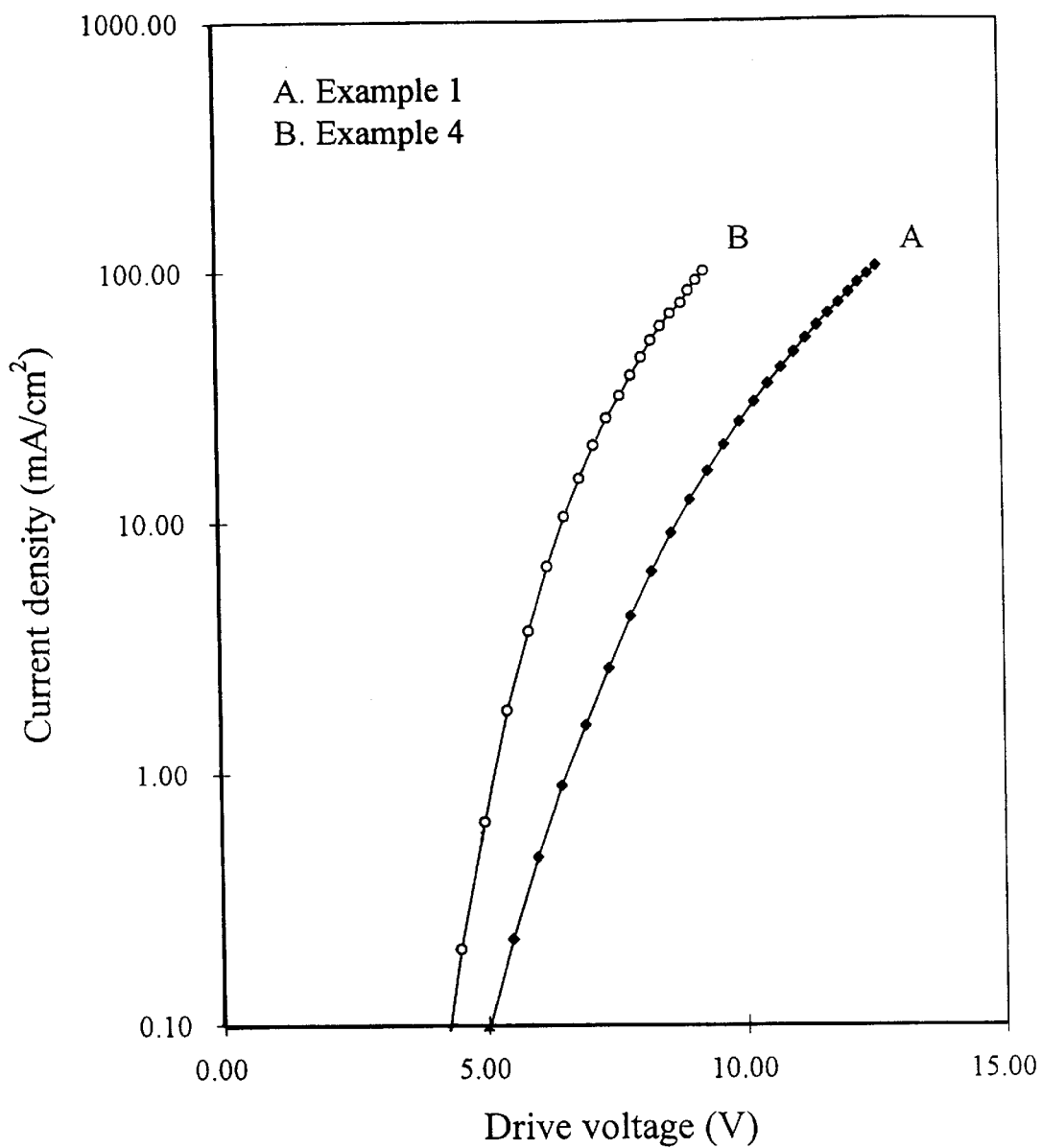
FIG. 3 shows plots of current-voltage characteristics for a conventional device and the device schematically shown in FIG. 2.

FIG. 3 shows current-voltage characteristics of the devices described in Examples 1 and 4.

Figure 4:
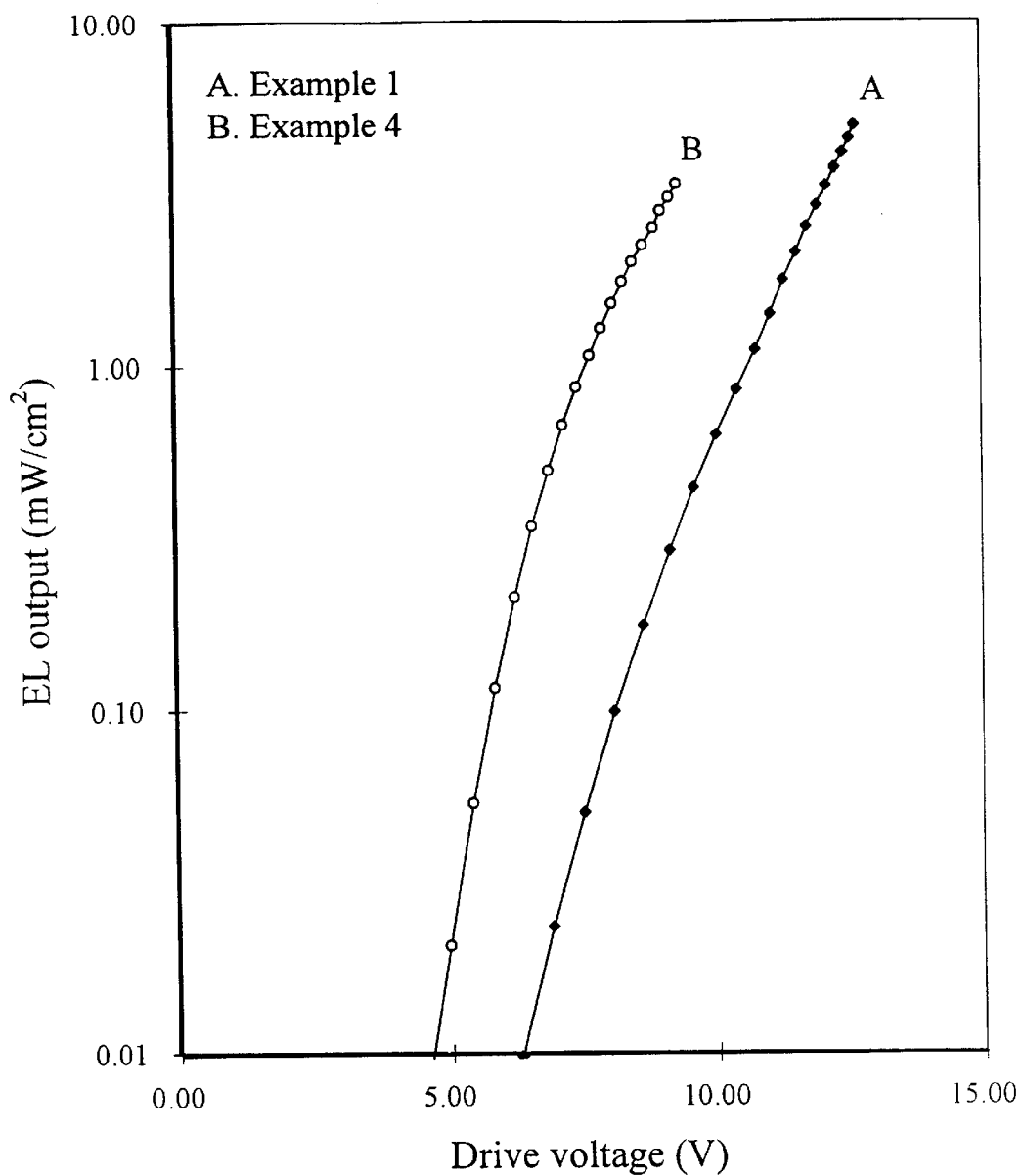
FIG. 4 shows plots of luminescence-voltage characteristics for a conventional device and the device shown in FIG. 2.

FIG. 4 shows luminescence output of the two devices as a function of applied voltage. The results clearly indicate that the device with an inorganic electron transporting layer can be operated at lower voltages and exhibits higher EL output, as compared to the device with an organic electron transporting layer.

Example 5

An EL device satisfying the requirements of the invention was constructed in the following manner. The EL medium has three organic layers, namely, a hole injecting layer, a hole transporting layer, and an luminescent layer, and two inorganic layers, namely a fluoride layer and an electron transporting layer.

a) An indium-tin-oxide (ITO) coated glass substrate was sequentially ultrasonicated in a commercial detergent, rinsed in deionized water, degreased in toluene vapor and exposed to oxygen plasma for a few minutes.

b) A hole injecting layer of copper phthalocyanine (150 Angstroms) was then deposited on top of the ITO coated substrate by evaporation from a tantalum boat.

c) Onto the copper phthalocyanine layer was deposited a hole transporting layer of N,N→-bis-(b 1-naphthyl)-N, N-diphenylbenzidine (600 Angstroms), also by evaporation from a tantalum boat.

d) A luminescent layer of Alq doped with 1% coumarin 6 ( 300 Angstroms) was then deposited onto the hole transporting layer by evaporation from a tantalum boat.

e) A thin layer of LiF (10 Angstroms) was then deposited onto the luminescent layer by evaporation from a tantalum boat.

f) An electron transporting layer of indium oxide (350 Angstroms) was then deposited onto the fluoride layer by evaporation from a graphite boat in oxygen at $10^{-4}$ Torr.

g) On top of the electron transporting layer was deposited by evaporation a cathode layer (2000 Angstroms) formed of a 10:1 atomic ratio of Mg and Ag.

The above sequence completed the deposition of the EL device. The device was then hermetically packaged in a dry glove box for protection against ambient environment.

Current-voltage characteristics were quite similar to those observed in Example 4. The EL output at a fixed voltage was slightly lower than that reported in Example 4.

The invention has been described in detail with particular reference to certain preferred embodiments thereof, but it will be understood that variations and modifications can be effected within the spirit and scope of the invention. For example, the electron transporting layer can be a single inorganic layer or an inorganic layer with a underlying organic layer.

PARTS LIST

- 100 EL device
- 102 Substrate
- 104 Anode
- 106 Cathode
- 108 EL medium
- 110 Organic hole transporting layer
- 112 Organic luminescent layer
- 114 Inorganic electron transporting layer PARTS LIST -continued

- 200 EL device
- 202 Substrate
- 204 Anode
- 206 Cathode
- 208 EL medium
- 210 Organic hole injecting layer
- 212 Organic hole transporting layer
- 214 Organic luminescent layer
- 216 fluoride layer
- 218 Inorganic electron transporting layer

What is claimed is:

1. An organic EL device, comprising an anode and a cathode, an organic hole transporting layer between the anode and the cathode, an organic luminescent layer on the organic hole transporting layer, and an inorganic electron transporting layer over the organic luminescent layer.

2. The organic EL device of claim 1, wherein the thickness of the electron transporting layer is in the range of 20–2,000 nm.

3. The organic EL device of claim 2, wherein the thickness of the electron transporting layer is in the range of 50–500 nm.

4. The organic EL device of claim 1, wherein the electron transporting layer is formed of an inorganic n-type semiconducting material.

5. The organic EL device of claim 4, wherein the resistivity of the inorganic n-type semiconducting material is in the range of 1 to $10^5$ ohm-cm.

6. The organic EL device of claim 4, wherein the inorganic n-type semiconducting material is selected from the group consisting of a metal oxide, metal nitride, zinc sulfide, zinc selenide, and zinc telluride.

7. The organic EL device of claim 6, wherein the metal oxide includes zinc oxide, indium oxide, titanium oxide, strontium titanium oxide, or barium titanium oxide.

8. The organic EL device of claim 6, wherein the metal nitride includes gallium nitride or indium gallium nitride.

9. An organic EL device, comprising an anode, an organic hole transporting layer on the anode, an organic luminescent layer on the organic hole transporting layer, a fluoride layer on the organic luminescent layer, an inorganic electron transporting layer on the fluoride layer, and a cathode on the electron transporting layer.

10. The organic EL device of claim 9, wherein the thickness of the fluoride layer is in the range of 0.3 to 5.0 nm.

11. The organic EL device of claim 10, wherein the thickness of the fluoride layer is in the range of 0.5–2.5 nm.

12. The organic EL device of claim 9, wherein the fluoride layer is an alkali fluoride or an alkaline earth fluoride.

13. The organic EL device of claim 9, wherein the thickness of the electron transporting layer is in the range of 20–2,000 nm.

14. The organic EL device of claim 13, wherein the thickness of the electron transporting layer is in the range of 50–500 nm.

15. The organic EL device of claim 9, wherein the electron transporting layer is formed of an inorganic n-type semiconducting material.

16. The organic EL device of claim 15, wherein the resistivity of the inorganic n-type semiconducting materials is in the range of 1 to $10^5$ ohm-cm.

17. The organic EL device of claim 12, wherein the alkali fluoride includes lithium fluoride, sodium fluoride, potassium fluoride, rubidium fluoride, or cesium fluoride.

18. The organic EL device of claim 12, wherein the alkaline earth fluoride includes magnesium fluoride, calcium fluoride, strontium fluoride, or barium fluoride.

19. The organic EL device according of claim 15, wherein the in organic n-type semiconducting material is selected from a metal oxide, a metal nitride, a zinc sulfide, a zinc selenide, or a zinc telluride.

20. The organic EL device according of claim 19, wherein the metal oxide includes zinc oxide, indium oxide, titanium oxide, strontium titanium oxide, or barium titanium oxide.

21. The organic EL device according of claim 19, wherein the metal nitride includes gallium nitride or indium gallium nitride.

* * * * *